United States Patent [19]

Fisher et al.

[11] Patent Number: 5,422,789
[45] Date of Patent: Jun. 6, 1995

[54] PRINTED CIRCUIT BOARD COMPONENT MOUNTING DEVICE

[75] Inventors: Francis E. Fisher, Swindon; Robin D. Johnson, Bath, both of United Kingdom; William D. Jordan, Dallas, Tex.

[73] Assignee: Redpoint Thermalloy Limited, United Kingdom

[21] Appl. No.: 146,323

[22] Filed: Nov. 2, 1993

[30] Foreign Application Priority Data

Nov. 4, 1992 [GB] United Kingdom ............. 9223064

[51] Int. Cl.6 .......................................... H05K 7/20
[52] U.S. Cl. ................... 361/719; 24/295; 361/809; 411/352; 411/520; 439/567
[58] Field of Search ............ 174/16.3; 248/27.3, 248/73, 221.4, 239; 24/295, 453, 457, 458, 543, 545, 555, 570, 573.1, 573.2; 361/697, 707, 709, 719, 720, 721, 784, 807, 809, 810; 403/408.1; 257/706, 718, 723; 411/347, 352, 553, 500, 511, 516, 520, 360, 363; 439/82, 554, 557, 567, 571, 572, 751, 873, 825-827

[56] References Cited

U.S. PATENT DOCUMENTS

| | | |
|---|---|---|
| 3,066,367 | 12/1962 | Garman .................. 24/81 |
| 3,673,643 | 7/1972 | Kindell .................. 24/295 |
| 4,321,423 | 3/1982 | Johnson ................. 174/16.3 |
| 4,393,560 | 7/1983 | Kato ..................... 24/295 |
| 4,495,380 | 1/1985 | Ryan ..................... 24/453 |
| 4,602,315 | 7/1986 | Breese ................... 361/388 |
| 4,625,260 | 11/1986 | Jordan ................... 361/386 |
| 4,783,899 | 11/1988 | Breese ................... 29/525 |
| 4,964,198 | 10/1990 | McCarthy ............... 24/458 |
| 5,015,802 | 5/1991 | Chi ....................... 174/35 GC |
| 5,101,540 | 4/1992 | Roof ..................... 24/458 |
| 5,145,407 | 9/1992 | Obata .................... 439/567 |
| 5,186,517 | 2/1993 | Gilmore ................. 24/295 |
| 5,263,233 | 11/1993 | Kim ...................... 24/295 |

*Primary Examiner*—Gerald P. Tolin
*Attorney, Agent, or Firm*—Jack A. Kanz

[57] ABSTRACT

A sheet metal device for mounting a component on a circuit board is formed by stamping to defining a head portion and a base portion. The head portion is formed for insertion into a slot in a component such as a heat sink and the base portion is formed for insertion into a printed circuit board. The head portion has spade-form members which engage the walls of the slot and retain the head portion in the slot. The component is mounted on a printed circuit board by inserting the base portion into an aperture in the printed circuit board and soldering the base portion to the reverse surface of the board.

20 Claims, 3 Drawing Sheets

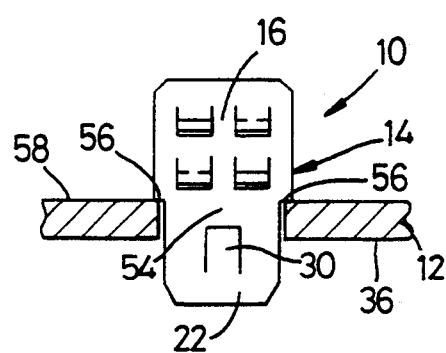
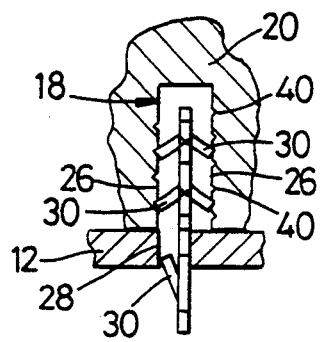
Fig. 4(a)　　　　　Fig. 4(b)
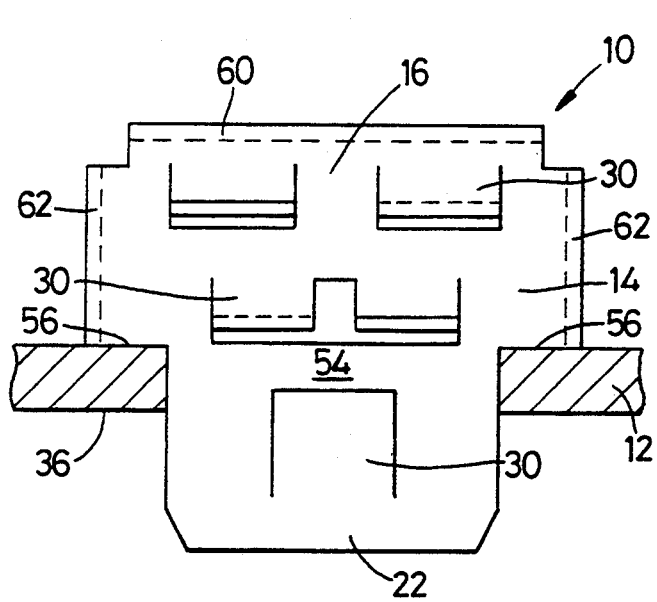
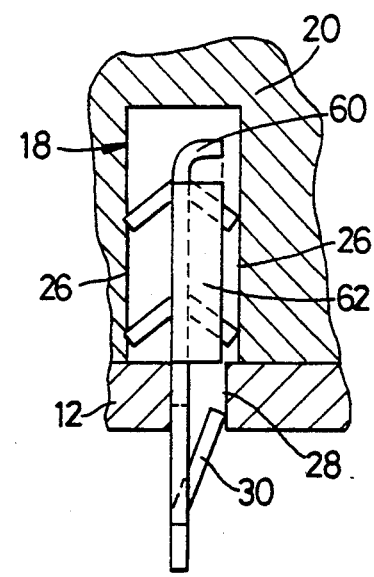
Fig. 5(a)　　　　　Fig. 5(b)

PRINTED CIRCUIT BOARD COMPONENT MOUNTING DEVICE

The present invention relates to printed circuit board (pcb) component mounting devices and more particularly to such devices for mounting semiconductor heatsinks on pcbs.

Semiconductor heatsinks are mounted on pcbs to be in contact with certain components (normally electronic) to dissipate heat from said components. In some cases a heatsink is relatively massive when compared to the component contacting with it.

The component can, with other components, be soldered to the pcb by firstly locating the components on the pcb by inserting their contact pins (terminals) in ready formed apertures in the pcb and then passing the pcb over a solder bath to solder said pins to a reverse surface of the pcb thus forming electrical circuit connections. However, whilst relatively small heatsinks can also be mounted in this way simultaneously with the components, larger heatsinks must subsequently be separately screwed to the pcb or separately soldered thereto thus complicating and increasing the cost of the pcb circuit assembly process.

In the case of separate soldering of massive heatsinks, the sinks are provided with large solder pins which locate through relatively large preformed apertures in the pcb. Heat required for separately soldering such a large component to the pcb can damage already formed solder joints thus jeopardising the integrity of the circuit assembled on the pcb.

It can be economically worthwhile to recover relatively massive heatsinks from discarded or defective pcbs but recovery of such heatsinks secured to the pcbs by the methods mentioned above is labour intensive and therefore not always cost effective.

It is one object of the present invention to obviate or mitigate the above problems in order to provide a less expensive pcb circuit assembly process.

It is another object of the present invention to provide a device and method for mounting relatively massive components, particularly semiconductor heatsinks, on a pcb whereby the mounting device can be mounted on the pcb simultaneously with electronic components by the solder bath or other suitable method, the device being such that a large component to be mounted to the pcb thereby can be push fitted onto the device by locating a head portion of the device in a pre-formed slot in the component.

It is yet another aspect of the present invention to provide a device for mounting relatively large components on a pcb whereby said large components can be easily recovered from defective or discarded pcbs.

According to one aspect of the present invention there is provided a printed circuit board component mounting device comprising:

a sheet-metal member having a head portion formed to be locatable in a slot of a component to be mounted by the device on a printed circuit board; and a base portion formed to be locatable in an aperture in the board and to partially extend therethrough to be soldered to a reverse surface of the board to retain said device on the board for mounting a component thereon.

Preferably, the head portion is formed to be locatable in a slot of a component by stamping at least one spade-form member from said portion such that said spade-form member projects at an angle from the plane of the head portion and is directed generally downwardly towards said base portion wherein, in use, said head portion locates within the slot of a component and said spade-form member engages a side wall of said slot.

Alternatively, the head portion may be formed to be locatable in a slot of a component by bending over a top edge portion of said head portion to provide a spade-form member depending at an angle from the plane of the head portion and directed generally downwardly towards said base portion wherein, in use, said head portion locates within the slot of a component and said spade-form member engages a side wall of the slot.

Preferably, the base portion is formed to engage an aperture in a printed circuit board by stamping at least one spade-form member from said portion such that said spade-form member projects at an angle from the plane of the base portion and is directed generally upwardly towards said head portion wherein, in use, said base portion locates through an aperture in the board and said spade-form member engages a side wall of the aperture.

Alternatively, the base portion may be formed to be locatable through an aperture in a board by bending over a lower edge portion of said base portion to provide a spade-form member depending at an angle from the plane of the base portion and directed generally upwardly towards the head portion wherein, in use, said base portion locates through an aperture in the board and said spade-form member engages a side wall of the aperture.

Alternatively further, the base portion may comprise a spade-form member of arcuate form extending in the plane of the sheet-metal member.

The head portion may have two spade-form members which depend outwardly from respective oppositely facing faces of said portion to engage, in use, respective opposing side walls of a slot in a component.

The base portion may have two spade-form members which depend outwardly from respective oppositely facing faces of said portion to engage, in use, the side wall of an aperture in a printed circuit board.

A top edge portion of the head portion may be bent over to generally lie in a plane at an angle to the plane of the head portion.

Preferably, the plane in which the bent over top edge portion lies is generally at right-angles to the plane of the head portion.

A side edge portion of the sheet-metal member may be bent to generally lie in a plane at an angle to the plane of said sheet-metal member.

Preferably, the plane in which said bent side edge portion lies is generally at right-angles to the plane of the sheet-metal member.

Preferably, the width of the base portion is less than that of the sheet-metal member.

The device may have two or more base portions.

The device may include an integrally formed support member depending generally away from the plane of the sheet-metal member such that, in use, a distal end of the support member rests upon an upper surface of a printed circuit board to hold a component mounted on the device with its base resting on the support member spaced from said upper surface of the board.

Preferably, the support member comprises a first portion depending generally away form the plane of the sheet-metal member in a direction normal thereto, and a second portion depending generally downwardly from said first portion such that, in use, the base of a component mounted on the device rests only on the first portion of the support member.

Preferably, the support member is formed by stamping said member from the plane of the sheet-metal member.

Preferably further, the support member is formed by stamping from a side edge portion of the sheet-metal member.

The device may include two support members which depend outwardly from respective oppositely facing faces of the sheet-metal member.

According to a second aspect of the present invention there is provided a printed circuit board having a device in accordance with the next nineteen preceding paragraphs fixed thereto by soldering.

According to a third aspect of the present invention there is provided a method of mounting a component to a printed circuit board using a device according to any of the next but one nineteen preceding paragraphs comprising the steps of:

mounting a device on a printed circuit board such that a base portion of the device locates through an aperture in the board; soldering the base portion of the device to a reverse surface of the board to that upon which the device is mounted; and mounting a component having a slot therein on the board by placing said component on the device such that the head portion of the device locates within the slot of the component such that a spade-form member of the head portion engages a side wall of the slot.

The foregoing and further features of the present invention will be more readily understood from the following description of preferred embodiments, by way of example thereof, by reference to the accompanying drawings, of which:

FIG. 1b shows a cross-sectional side view of the device of FIG. 1a;

FIG. 2b shows a cross-sectional side view of the device of FIG. 2a;

FIG. 3b shows a cross-sectional side view of the device of FIG. 3a;

FIG. 4a shows a front elevational view of a fourth embodiment of a component mounting device according to the present invention mounted on a printed circuit board;

FIG. 4b shows a cross-sectional side view of the device of FIG. 4a;

FIG. 5a shows on larger scale a front elevational view of a fifth embodiment of a component mounting device according to the present invention mounted on a printed circuit board;

FIG. 5b shows a cross-sectional side view of the device of FIG. 5a;

FIG. 6b shows a cross-sectional side view of the device of FIG. 6a;

FIG. 7b shows a cross-sectional side view of the device of FIG. 7a.

Figure 1A:
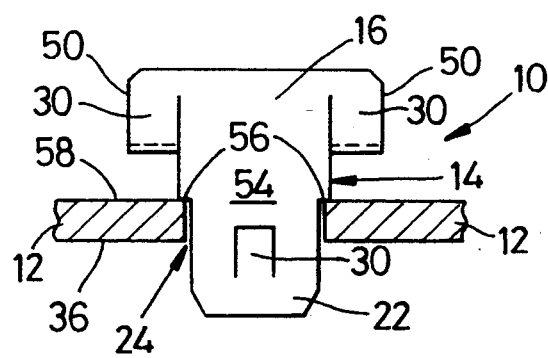
FIG. 1a shows a front elevational view of a first embodiment of a component mounting device according to the present invention mounted on a printed circuit board.

FIGS. 1 to 7 show various embodiments of an integrally formed sheet-metal device 10 for mounting relatively large components particularly semiconductor heatsinks, to a printed circuit board 12 (pcb). Each of the figures (a) and (b) shows a front elevational and a side sectional view respectively of an embodiment of the mounting device 10 mounted on a pcb 12. In the following description like numerals are used to denote like parts.

Each device includes a sheet-metal member 14 having a head portion 16 for locating in a slot 18 of a component 20 (partially shown in the side views of the figures) to be mounted by the device 10 to a pcb 12. Each device 10 also includes a base portion 22 which extends through an aperture 24 formed in the pcb. The aperture 24 in the pcb is intended to be of generally standard size as employed for directly mounting normal size components such as integrated circuit chips, transistors or resistors, for example, to the pcb 14 to thus avoid complicating the pcb circuit assembly process.

The head portion 16 of the device is either formed with a stamped out spade-form member 30 and/or a rolled over spade-form member 32, each of which act in an identical manner to engage in a slot 18 of a component 20. Similarly, the base portion 22 is formed with a stamped out spade-form member 30 and/or a rolled over spade-form member 32.

In use, the spade-form member (30, 32) of the base portion 22 engages a side wall 28 of an aperture 24 of the pcb 12 and a pull-out force applied to the device 10 causes the spade-form member (30, 32) to imbed firmly into the material of the pcb 12. The base portion 22 of the device 10 extends through the aperture 24 and can be soldered by normal techniques, such as the solder bath method, to a reverse surface 36 of the pcb simultaneously with the soldering of other components on the pcb 12. The degree to which the spade-form member (30, 32) extends away from the base portion 22 is chosen such that the base portion and spade-form member combination forms a friction fit in an aperture 24 in a pcb 12 thus holding the device 10 in a stable position until the soldering process is complete. The spade-form member (30, 32) of the base portion is generally flat across its width. This provides a greater surface area between the spade-form member and aperture surfaces for contact with solder (not shown) than in the conventional case where a component is mounted on a pcb by means of wire-like terminals.

Figure 3A:
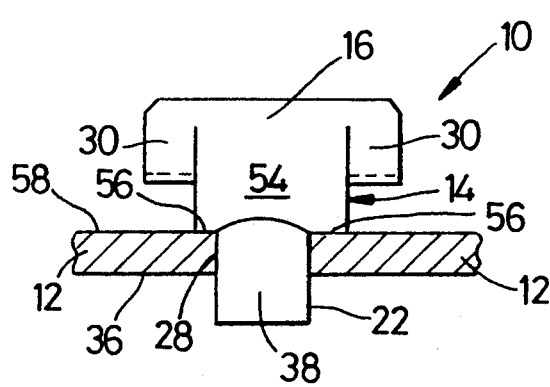
FIG. 3a shows a front elevational view of a third embodiment of a component mounting device according to the present invention mounted on a printed circuit board.
Figure 3B:
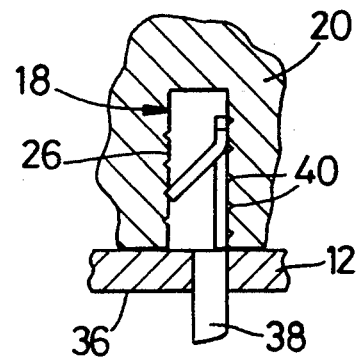

The base portion 22 may, however, comprise a spade-form member 38 of arcuate form extending in the plane of the sheet-metal member, as shown in FIG. 3. It will be understood that the base portion can comprise a spade-form member of any suitable shape for securing the device by soldering to a pcb.

A component 20 such as a semiconductor heatsink can be mounted on a pcb 12 by mounting on the device 10 subsequent to the device having been soldered to the pcb. It is intended that components such as heatsinks are mounted onto the head portion 16 of the device 10 having firstly been formed with a suitably shaped slot in a base part thereof. In use, the component 20 can be push-fitted onto the head portion 16 of a mounting device 10 such that the spade-form member (30, 32) of the head portion engages a side wall 26 of the slot in the component. The side wall 26 of the slot 18 may have serrations 40 to improve the grip of the head portion in the slot and to increase its resistance to being forcably extracted. However, since the device 10 is formed of sheet-metal material, the spade-form member (30, 32) will possess some resilience which improves the fitting grip and assists in more easily retrieving the component 20 from the device 10.

Further features of the various embodiments of the invention will be described with reference to specific figures.

Figure 1B:
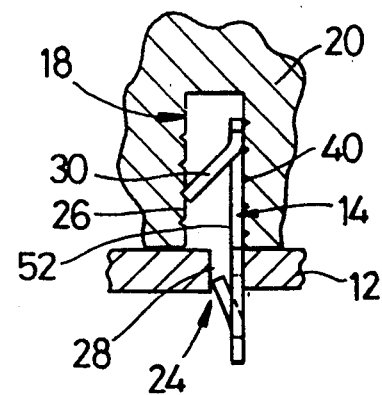

FIG. 1 shows a first embodiment of the invention. This is of simple form, the head portion 16 having two integrally formed spade-form members 30 stamped from widthwise extending side edge portions 50, both of said spade-form members 30 depending in the same direction away from a face 52 of the head portion 16.

The base portion 22 of the device has a single integrally formed spade-form member 30, also formed by stamping, which depends outwardly in the same direction as the spade-form members of the head portion.

The base portion is of lesser width than a central portion 54 of the sheet-metal member extending between the head and base portions. Accordingly, at sides of a line defining the junction between the central and base portions 54, 22), there are provided shoulders 56 which assist in the accurate location of the device 10 on a pcb 12. These shoulders contact with an upper surface 58 of the pcb and thus ensure that the base portion projects through an aperture in the pcb such that an outer edge of the spade-form member engages a side wall of the aperture.

The device can be positioned ready for soldering on the pcb simultaneously with other components (normally electronic) and by similar methods. Once all components, including component mounting devices, are positioned on the pcb, they can then be secured thereto by passing over a solder bath or by some other suitable soldering method.

Figure 2A:
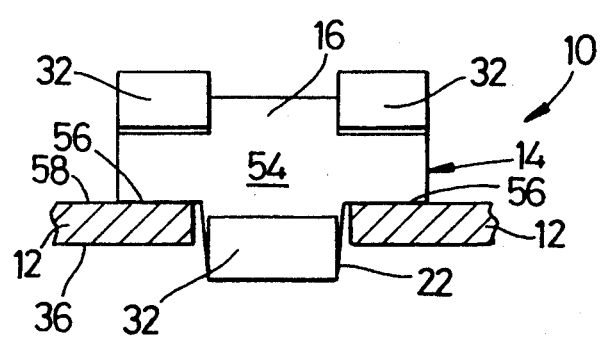
FIG. 2a shows a front elevational view of a second embodiment of a component mounting device according to the present invention mounted on a printed circuit board.
Figure 2B:
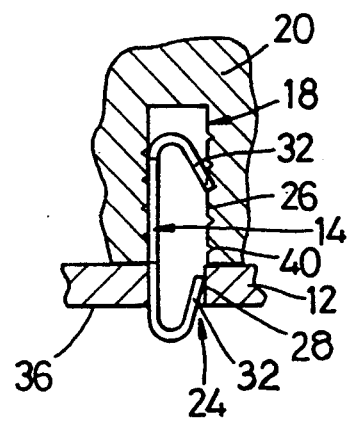

The embodiment of FIG. 2 is similar to that of FIG. 1 insofar that it also has a head portion 16 including two spade-form members 32 and a base portion 22 with a single spade-form member 32.

Indeed, in this embodiment the width of the base portion 16 is also less than that of the central portion 54. However, in this embodiment the spade-form members 32 of the head portion are formed by bending over top edge portions of side portions of the head portion. Similarly, the spade-form member of the base portion is formed by bending an edge portion but the spade-form members 32 act in identical manner to those of the first embodiment.

The embodiment of FIG. 3 is also similar to that of FIG. 1 but differs in that the base portion 22 has been formed by pressing to provide a single arcuate spade-form member 38 which is adapted to fit in a generally circular aperture in a pcb. The shape of the spade-form member 38 is such that it provides a friction fit in the aperture 24 of the pcb 12 with its outer cuffed surface in contact with a portion of a side wall 28 of said aperture 24.

FIG. 4 illustrates an embodiment of the device in which the head portion 16 has a number of spade-form members 30 arranged in rows. The spade-form members are integrally formed by stamping but are arranged such that alternate spade-form members depend from oppositely facing faces of said head portion. In use, when the head portion is inserted in a slot 18 of a component 20, the oppositely directed spade-form members 30 engage opposing side walls 26 of said slot. Such an arrangement can improve the grip between the device and component particularly where both side walls of the slot and the component have serrations 40.

The embodiment of FIG. 5 is similar to that of FIG. 4 insofar that it also has a head portion 16 having a number of rows of spade-form members 30. These also are arranged to depend alternately from oppositely facing faces of the head portion.

In this embodiment, however, a top edge portion 60 of the head portion is bent over to lie in a plane substantially at right-angles to the plane of the head portion. This portion 60 acts to provide a contact zone for manually applying pressure to the device 10 when inserting it on a pcb 12. Experience has shown that, where this feature is absent, the top edge of the device 10 can be sharp and cause injury when manual pressure is applied on this edge during insertion of the device on the board. In addition, the bent edge portion 60 provides rigidity in the device in a transverse direction across its width.

in addition to the bent over top portion 60, side edge portions 62 of the head portion 16 are bent to lie in a plane at right-angles to the plane of the head portion. The bent side edge portions 62 provide rigidity to the device in a depth-wise direction and also improve the stability of the device when inserted on a pcb. The bent side edge portions contact on an upper surface 58 of the pcb and ace to prevent rotational movement of the device in a direction normal to the plane of the device 10 when a component 20 is being push fitted onto the device.

It can be seen from the embodiments of 1 to 5 that the base portion 22 of the device 10 is shown as having or comprising only one spade-form member (30, 32, 38). It will be clearly understood that this portion 22 of the device may be formed with a number of such spade-form members suitably arranged for contact, in use, with a side wall 28 of an aperture 24 on a pcb 12. In addition, in FIGS. 1 to 5, the base portion is shown to be located in an aperture which is generally elongate in shape. It will be understood that the width of the base portion 22 can be reduced in order that the base portion might locate in a standard circular aperture on a pcb.

Figure 6A:
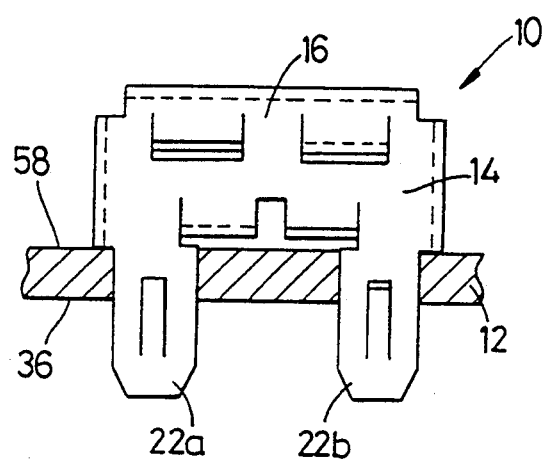
FIG. 6a shows a front elevational view of a sixth embodiment of a component mounting device according to the present invention mounted on a printed circuit board.
Figure 6B:
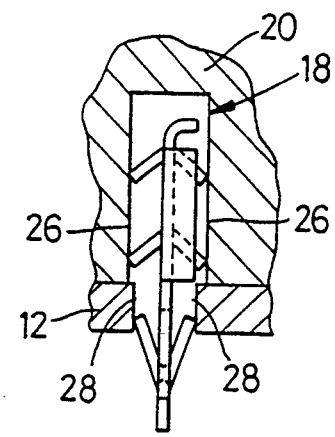

FIG. 6 shows a sixth embodiment of the invention which has a configuration generally similar to that of the embodiment of FIG. 5. However, in this embodiment the device has two base portions (22a,b) each formed with a spade-form member 30. The spade-form member of the first base portion 22a extends in a direction generally opposite to that of the spade-form member of the second base portion 22b. Therefore, in use, this embodiment of the device can be mounted on a pcb 12 by locating said base portions (22a,b) in separate apertures 24, or alternatively, by locating said base portions in a single elongate aperture whereby said spade-form members each contact with respective opposing side walls of said aperture.

Figure 7A:
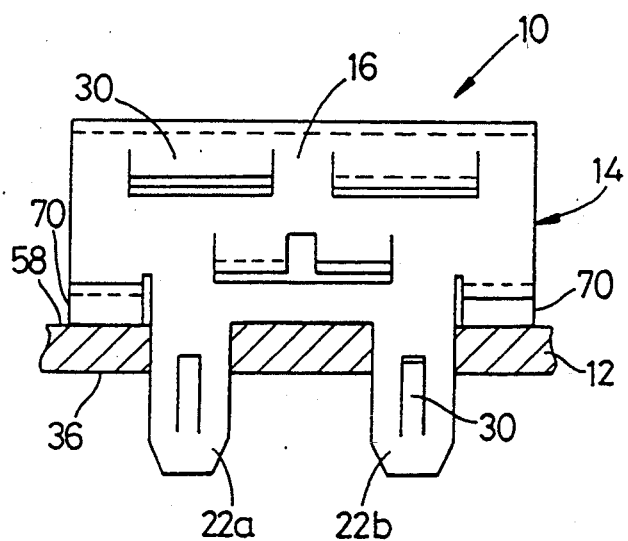
FIG. 7a shows a front elevational view of a seventh embodiment of a component mounting device according to the present invention mounted on a printed circuit board.
Figure 7B:
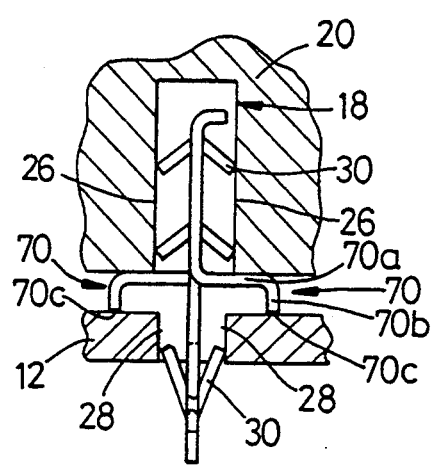

FIG. 7 shows a seventh embodiment of the invention which is generally similar to the embodiment of FIG. 6. However, this embodiment includes support members 70 extending generally outwardly from the plane of the sheet-metal member 14. Each of said support members 70 comprises a first portion 70a extending in a direction normal to the plane of the sheet-metal member 14 and a second portion 70b depending from the first portion in a downward direction generally at right-angles thereto. In use, the distal ends 70c of the support members 70 contact with an upper surface 58 of a pcb 12. The support members 70 extend from the plane of the sheet-metal member 14 for a distance sufficient to allow a component 20 mounted on the device 10 to rest with its base on the first portions 70a of said support members 70 such that the component is mounted to the pcb spaced above the upper surface 58 thereof. The support members facilitate washing of the pcb. The support members are integrally formed from the sheet-metal member 14 by stamping from edge portions of said member.

We claim:

1. A combination comprising:
   (a) a printed circuit board;
   (b) a circuit board component; and
   (c) a component mounting device comprising:
      i. a sheet-metal member having a head portion located in a slot in said component and having at least one spade-form member which projects at an angle from the plane of the head portion and is directed generally downwardly toward the base portion to engage a side wall of said slot; and
      ii. a base portion located in an aperture in said circuit board and soldered to a reverse surface of the board to retain said mounting device on said board.

2. A combination as defined in claim 1 wherein the base portion includes at least one base spade-form member which projects at an angle from the plane of the base portion and is directed generally upwardly toward said head portion to engage a side wall of said aperture.

3. A combination as defined in claim 1 wherein said head portion has spade-form members which depend outwardly from respective oppositely facing faces of said head portion to engage opposing side walls of a slot in said component.

4. A combination as defined in claim 2 wherein said base portion has base spade-form members which depend outwardly from respective oppositely facing faces of said base portion to engage the side walls of an aperture in said printed circuit board.

5. A combination as defined in claim 1 wherein a top edge portion of said head portion is bent over to lie generally in a plane at an angle to the plane of the head portion.

6. A combination as defined in claim 5 wherein the plane in which the bent over top edge portion lies is generally at right angles to the plane of the head portion.

7. A combination as defined in claim 1 wherein said at least one spade-form member is formed by stamping said at least one spade-form member from said head portion.

8. A combination as defined in claim 2 wherein said at least one base spade-form member is formed by stamping said at least one base spade-form member from said base portion.

9. A combination as defined in any preceding claim wherein at least one side edge portion of the sheet-metal member is bent to lie generally in a plane at an angle to the plane of said sheet-metal member.

10. A combination as defined in claim 9 wherein the plane in which said bent over side edge portion lies is generally at right angles to the plane of the sheet-metal member.

11. A combination as defined in claim 11 wherein said spade-form member is formed by bending over a top edge portion of said head portion.

12. A combination as defined in claim 2 wherein said base spade-form member is formed by bending over a lower edge portion of said base portion.

13. A combination as defined in claim 1 wherein the base portion includes a spade-form member of arcuate form extending from the plane of the sheet-metal member.

14. A combination as defined in claim 1 wherein the width of the base portion is less than that of the sheet-metal member.

15. A combination as defined in claim 1 wherein the component mounting device has at least two base portions.

16. A combination as defined in any of claims 1–8 or 11–15 wherein the component mounting device includes an integrally formed support member depending generally away from the plane of the sheet-metal member such that a distal end of said support member rests on a surface of the printed circuit board and holds the board component mounted on the component mounting device with its base resting on the support member spaced from said surface of said board.

17. A combination as defined in claim 16 wherein the support member comprises a first portion depending generally away from the plane of the sheet-metal member in a direction normal thereto and a second portion depending generally downwardly from said first portion such that the base of the board component mounted on the component mounting device rests only on said first portion of said support member.

18. A combination as defined in claim 16 wherein the support member is formed by stamping said support member from the sheet-metal member.

19. A combination as defined in claim 18 wherein the support member is formed by bending a side edge portion of the sheet-metal member.

20. A combination as defined in claim 19 wherein the component mounting device includes two support members which depend outwardly from respective oppositely facing faces of the sheet-metal member.

* * * * *

UNITED STATES PATENT AND TRADEMARK OFFICE
CERTIFICATE OF CORRECTION

PATENT NO. : 5,422,789

DATED : June 6, 1995

INVENTOR(S) : Francis E. Fisher, et al.

It is certified that error appears in the above-identified patent and that said Letters Patent is hereby corrected as shown below:

Col. 5, line 66, change "cuffed" to read ---curved---

Col. 6, line 29, change "in" to read ---In---

Col. 6, line 36, change "ace" to read ---act---

Col. 8, line 15, change "claim 11 wherein" to read ---claim 1 wherein---

Signed and Sealed this

Twelfth Day of September, 1995

Attest:

BRUCE LEHMAN

Attesting Officer   •   Commissioner of Patents and Trademarks